United States Patent [19]

Wolny et al.

[11] Patent Number: 5,332,899
[45] Date of Patent: Jul. 26, 1994

[54] SYSTEM FOR CONVERTING AN INFRARED IMAGE INTO A VISIBLE OR NEAR INFRARED IMAGE

[75] Inventors: Michel Wolny; Daniel Amingual, both of Grenoble, France

[73] Assignee: Commissaeiat A l'Energie Atomique, Paris, France

[21] Appl. No.: 63,333

[22] Filed: May 19, 1993

[30] Foreign Application Priority Data

May 21, 1992 [FR] France ................ 92 06209

[51] Int. Cl.$^5$ ............................................ H01L 31/14
[52] U.S. Cl. ................... 250/332; 250/338.4; 250/370.08
[58] Field of Search ............ 250/330, 332, 334, 338.4, 250/370.08

[56] References Cited

U.S. PATENT DOCUMENTS

| | | | |
|---|---|---|---|
| 3,649,838 | 3/1972 | Phelan, Jr. | 359/321 |
| 4,067,104 | 1/1978 | Tracy | 29/626 |
| 4,205,227 | 5/1980 | Reed . | |
| 4,255,658 | 3/1981 | Hurst | 250/334 |
| 4,362,938 | 12/1982 | Bosserman | 250/334 |
| 4,575,632 | 3/1986 | Lange | 250/354 |
| 4,763,001 | 8/1988 | Poxleitner et al. | 250/334 |
| 4,914,296 | 4/1990 | Reinhold et al. | 250/390 |
| 4,943,491 | 7/1990 | Norton et al. | 250/332 |
| 4,998,688 | 3/1991 | Longerich et al. | 250/332 |

FOREIGN PATENT DOCUMENTS 0371868 11/1989 France .
0373807 12/1989 France .

OTHER PUBLICATIONS

Hatada, K. et al., "LED Array Modules by New Technology Microbump Bonding Method", *IEEE Transactions on Components, Hybrids and Manufacturing Technology*, vol. 13, No. 3, Sep. 1990.

Matsueda, H., "AlGaAs OEIC Transmitters", *Journal of Lightwave Technology*, vol. LT-5, No. 10, Oct. 1987, pp. 1382-1390.

Wada, O., "Planar Structure Optoelectronic Integrated Circuits: Towards Advanced Optical Processing and Communication", *International Electron Device Meeting*, Dec. 6, 1987, pp. 225-228.

Forrest, Stephen, R., "Optoelectronic Integrated Circuits", *Proceedings of the IEEE*, vol. 75, No. 11, Nov. 1987, pp. 1488-1496.

*Primary Examiner*—Paul M. Dzierzynski
*Assistant Examiner*—Drew A. Dunn
*Attorney, Agent, or Firm*—Burns, Doane, Swecker & Mathis

[57] ABSTRACT

A system for the conversion of an infrared image into a visible or near infrared image includes optical input and output devices, an infrared detector on which is formed an infrared image of a scene, a circuit for reading the signal supplied by the detector, a circuit for processing the signals from the reading circuit, a visible or near infrared light emitter for supplying the image in the form of visible or near infrared light from signals of the processing circuit, a circuit for addressing the emitter, and a substrate. One face of the substrate forms a focal plane common to the optical input and output devices. The detector, the reading, processing, and addressing circuits, as well as the emitter, are integrated in this focal plane.

15 Claims, 5 Drawing Sheets

SYSTEM FOR CONVERTING AN INFRARED IMAGE INTO A VISIBLE OR NEAR INFRARED IMAGE

DESCRIPTION

1. Field of the Invention

The present invention relates to a system for converting an infrared image into a visible or near infrared image.

2. Background

It more particularly applies to infrared imaging, e.g. to night vision and vision under difficult atmospheric conditions (e.g. when raining or in fog).

Devices are already known which make it possible to perform infrared imaging in atmospheric transmission windows (from 3 to 5 and 8 to 12 micrometers).

These devices or cameras either use a detector having a small number of elementary points, the coverage of the scene being ensured as a result of an optomechanical scanning or sensing, or in the case of the most advanced systems a detecting mosaic having a large number of points (e.g. 256×256) which then eliminates any need for scanning.

In the case of recent so-called "fixed mosaic systems", two technological options can be used in connection with the detector. These involve either the hybridization of the detector on its reading circuit (e.g. by means of indium microspheres) or the monolithic integration on a silicon substrate of the detector (which is e.g. constituted by a PtSi Schottky detector array) and its reading circuit.

In general terms, the known devices making it possible to carry out infrared imaging are characterized by a high performance level, but also by significant weight, dimensions and consumption. In connection with such devices reference can be made to the book:

(1) by G. GAUSSORGUES, La Thermographie Infrarouge, editions Lavoisier, Paris, 1984.

Night vision devices are also known which incorporate light intensifier tubes. The aim of the latter is to extend the range of human vision towards lower light levels by increasing the sensitivity spectrum towards the near infrared (optical wavelengths below 1 micrometer) and by amplifying the light level.

The known night vision devices generally use in the case of the most recent, third generation devices, a gallium arsenide-based photocathode, a microchannel wafer and a luminescent screen placed on an optical fibre window.

These night vision devices are mainly characterized by their compactness and limited weight, so that they can e.g. be used in night vision binoculars. However, the performance characteristics of these night vision devices are limited as a result of the spectral range covered by them. In connection with such devices reference can be made to:

(2) Article by M. Fouasser et al entitled "Third generation image intensifier tubes", published in Acta Electronica, vol. 27, No. 3 and 4, 1987, pp 159-163.

SUMMARY OF THE INVENTION

The present invention solves the problem of obtaining a system for converting an infrared image into a visible image (directly usable by the human eye) or a near infrared image, which can be made very compact and has a low weight so that it can easily be carried, said system offering an optimum combination of the respective advantages of the two devices referred to hereinbefore, namely the high performance level offered by medium infrared imaging (optical wavelengths from 3 to 5 micrometers) and in far infrared imaging (optical wavelengths from 8 to 12 micrometers) and the compactness and low weight of light intensifier tube equipments.

To solve this problem, the system according to the invention permitting the conversion of an infrared image into visible or near infrared image comprises optical input means, optical output means, an infrared detector on which is formed an infrared image of a scene, by means of the optical input means, a circuit for reading the signals supplied by said detector, a processing circuit of the signals supplied by the reading circuit, a visible or near infrared light emitter for supplying by means of the optical output means said image in the form of visible or near infrared light, from signals supplied by the processing circuit and a circuit for addressing the emitter, which is controlled by the processing circuit, said system being characterized in that it also comprises a semiconductor substrate, whereof one face constitutes a focal plane common to the optical input means and the optical output means and in that the detector, the reading circuit, the processing circuit, the addressing circuit and the emitter are integrated into said focal plane on the substrate.

An essential feature of the present invention is consequently the integration, in the focal plane of the system, of a light emitter and an infrared detector, which is connected to the light emitter by means of adapted electronic means.

According to a special embodiment of the system according to the invention, the detector is a mosaic of infrared detectors.

According to another embodiment, said detector is an array of infrared photodetectors and the system also comprises means for the optical scanning of said array.

According to another special embodiment, the emitter is a mosaic of photoemitters in the visible or near infrared range.

According to another embodiment, the emitter is an array of photoemitters in the near infrared or visible range and the system also comprises means for the optical scanning of said array.

In a special embodiment, the detector is hybridized with the reading circuit.

In another special embodiment, the detector and the reading circuit are monolithically integrated with the substrate.

In another special embodiment, the emitter is hybridized with the addressing circuit and said emitter is formed on a substrate transparent to the light produced by said emitter.

In another embodiment, the emitter is hybridized with the addressing circuit, said emitter being formed on a substrate opaque to the light emitted by said emitter and said opaque substrate has holes facing the photoemitters from which the emitter is formed, said holes permitting the passage of the light produced by said emitter.

In another special embodiment the emitter and the addressing circuit are monolithically integrated with the substrate.

Finally, the emitter can be able to produce light belonging to the near infrared range, the system then also having means for converting said light into visible light.

It should be noted that the present invention makes it possible to considerably reduce the overall dimensions and weight of thermal imaging systems operating in the mid and far infrared.

Moreover, the high integration level allowed by the present invention makes it possible to increase the reliability and reduce costs compared with known infrared imaging systems.

Moreover, when one of the components of a system according to the invention has been hybridized in the focal plane of the latter, if said component is defective, its replacement by a "healthy" component can be envisaged.

The invention is described in greater detail hereinafter relative to non-limitative embodiments and with reference to the attached drawings, wherein show:

DETAILED DESCRIPTION

Figure 1:
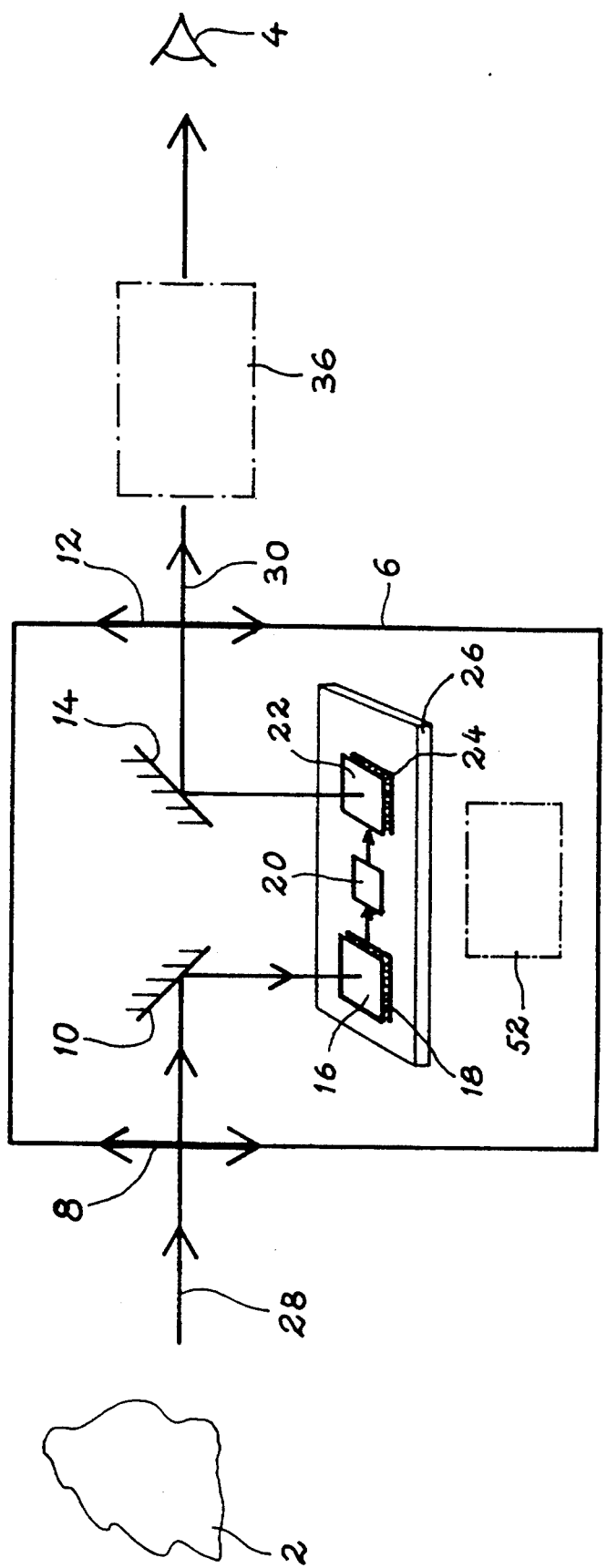
FIG. 1 A diagrammatic view of a special embodiment of the system according to the invention.

FIG. 1 diagrammatically shows a system according to the invention making it possible to convert the infrared image of a scene 2 observed by the system into a visible image directly exploitable by the eye of an observer 4.

Figure 2:
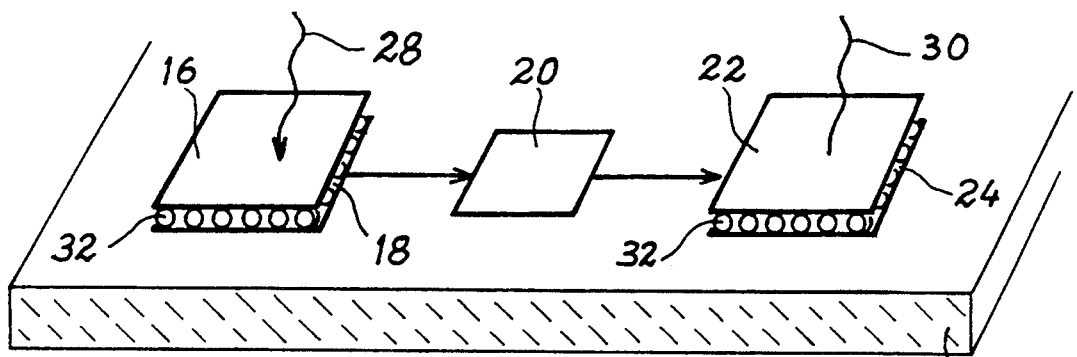
FIG. 2 A diagrammatic, partial view of the system of FIG. 1.

FIG. 2 is a partial, diagrammatic view of part of the system of FIG. 1. This system comprises in a box or case 6:

optical input means constituted by an input optics 8 and a mirror 10 able to reflect the infrared radiation, optical output means constituted by an output optics 12 and a mirror 14 able to reflect the visible radiation, a detector 16 of the infrared radiation on which is formed an infrared image of the scene, by means of the optical input means, a circuit 18 for reading the electric signals supplied by said detector 16, a circuit 20 for processing the electric signals supplied by said reading circuit 18, a visible light emitter 22 for supplying, via the optical output means, said image in the form of visible light, from electric signals supplied by the processing circuit 20 and a circuit 24 for addressing the emitter 22, said addressing circuit being controlled by the processing circuit 20.

The system shown in FIGS. 1 and 2 also comprises a silicon substrate 26, whereof one face constitutes a focal plane common to the optical input means and to the optical output means.

The detector 16, the reading circuit 18, the processing circuit 20, the addressing circuit 24 and the emitter 22 are integrated in said focal plane on said same face of the substrate 26.

The infrared radiation 28 from the scene 2 (e.g. countryside or object), traverses the input optics 8 and is then reflected on the mirror 10 to be focussed on the detector 16 by means of the optics 8 provided for this purpose.

The infrared image of the scene 2, which is obtained and detected in this way, is then read by the reading circuit 18, processed by the processing circuit 20 and then converted into a visible image directly observable by the eye of the observer 4 by means of the emitter 2 and the output optics 12 to which is supplied the visible light 30 emitted by the emitter 22 following reflection on the mirror 14.

The detector 16 is in the form of a mosaic of n×m elementary photodetectors, in which n and m are integers, e.g. both equal to 128. The elementary photodetectors are all of the same type and, in a purely informational and in no way limitative manner, can be chosen from within the following list for wavelengths from 3 to 5 micrometers and/or 8 to 12 micrometers:

P/N photodetectors on $Hg_{1-x}Cd_xTe$ or on $In_{1-x}As_xSb$, multiple quantum well photodiodes (e.g. $GaAs/Ga_{1-x}Al_xAs$), photodiodes based on internal photoemission above a potential barrier (e.g. PtSi/Si, IrSi/Si, $Si_{1-x}Ge_x/Si$), mineral or polymer pyroelectric detectors (e.g. lithium tantalate or polyvinyl difluoride).

In the example shown in FIG. 2, the infrared detection mosaic 16 is hybridized (by e.g. indium microspheres 32) with its reading circuit 18, which is produced on the silicon substrate 26.

Figure 3:
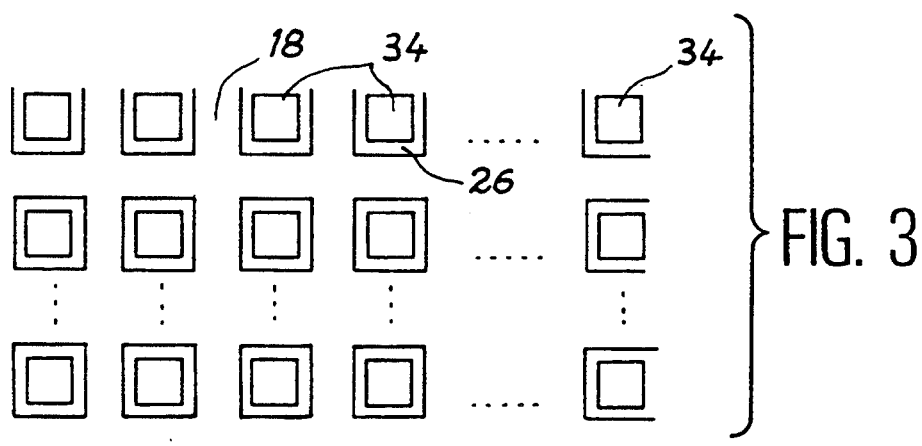
FIG. 3 A diagrammatic, partial view of a system according to the invention, in which the detector and the reading circuit of the latter are monolithically integrated onto the system substrate.

In another embodiment of the system diagrammatically and partially shown in FIG. 3, the infrared detection mosaic 16 having a plurality of elementary infrared photodetectors 34 and its reading circuit 18 are monolithically integrated onto the silicon substrate.

The various processes for the production of such infrared detectors are well known to the person of ordinary skill in the art. In this connection reference can e.g. be made to:

(3) Article by P. R. Norton entitled "Infrared image sensors", published in Optical Engineering, November 1991, vol. 30, No. 11, pp 1649 to 1663.

The light emitter 22 is in the form of a mosaic of p×q elementary photoemitters, where p is equal to or below n and q is equal to or below m, preferably with p=n and q=m.

It is thus possible to associate with each pixel or group of pixels of the detection mosaic 16, an elementary point of the emission mosaic 22.

As has been seen, the wavelength of the light emitted is in the visible spectrum.

However, it would be possible to use an emitter producing light in the near infrared range, i.e. having a wavelength below 1 micrometer. In this case, a device 36, identical to those used in light amplifier tube systems, is added to the system (cf. FIG. 1) for transforming the image emitted in the near infrared into an image visible by the observer 4.

As can be seen in FIG. 2, the emitting mosaic 22 can be hybridized on its addressing circuit 24 produced on the silicon substrate 26 by a procedure identical to that used for the hybridization of the detection mosaic on its reading circuit.

In another special embodiment, said emitting mosaic 22, having a plurality of elementary photoemitters 38, is integrated with its addressing circuit 24 in monolithic manner on the silicon substrate 26.

Figure 4:
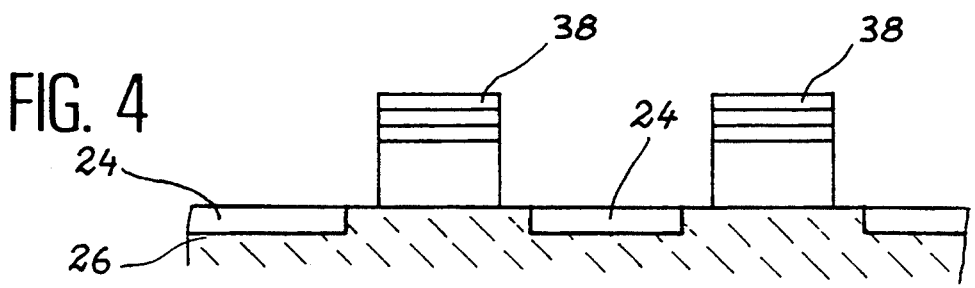
FIG. 4 A diagrammatic, part sectional view of a system according to the invention, in which the emitter and its addressing circuit are monolithically integrated onto the system substrate.
Figure 5:
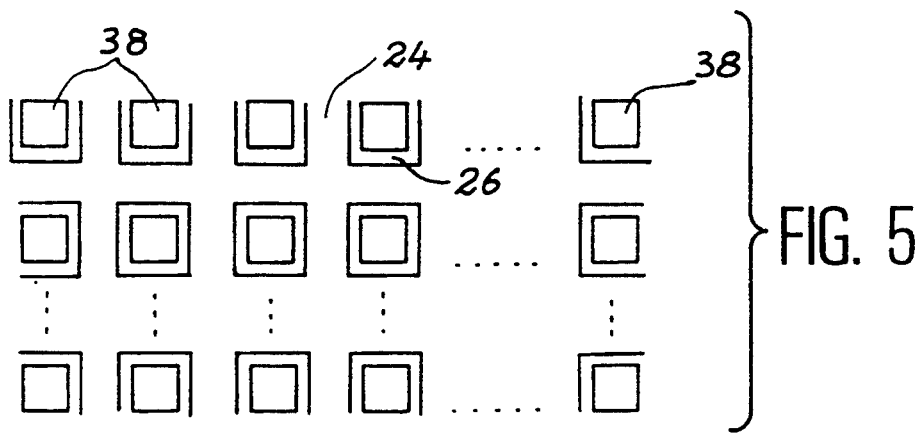
FIG. 5 A partial plan view of the system of FIG. 4.

This monolithic integration is illustrated by FIG. 4, which is a partial, diagrammatic sectional view of the system according to the invention in which said monolithic integration is used, whilst FIG. 5 is a diagrammatic, partial plan view of the system.

The elementary photoemitters (elementary points) of the emission mosaic 22 can either be light emitting diodes (e.g. $(Ga_{1-y}Al_y)_{1-x}In_xP$, $Ga_{1-x}As_xP$ diodes for an emission in the visible range or $GaAs/Ga_{1-x}Al_xAs$ diodes for an emission in the near infrared range) or vertical cavity laser diodes (e.g. $GaAs/Ga_{1-x}Al_xAs$).

The epitaxial growth of GaAs on silicon is well known to the person or ordinary skill in the art, as is that of $(Ga_{1-y}Al_y)_{1-x}In_xP$, GaAlAs/GaAs on GaAs.

The methods for producing each of these emitter components are described in the literature and reference can e.g. be made to the following documents:

(4) Article by S. F. Fang et al entitled "Gallium arsenide and other compound semiconductors on silicon" and published in J. Appl. Phys., vol. 68, No. 7, 1.10.1990, pp R31 to R58;

(5) Article by M. Mpaskoutas et al entitled "Uniformity-optical properties of GaInP-GaAlInP layers grown by MOVPE" and published in Journal of Crystal Growth, 107, 1991, pp 192 to 197;

(6) Article by H. Sugawara et al published in Appl. Phys. Lett., vol. 58, No. 10, 11.3.1991, pp 1010 to 1012.

Figure 6:
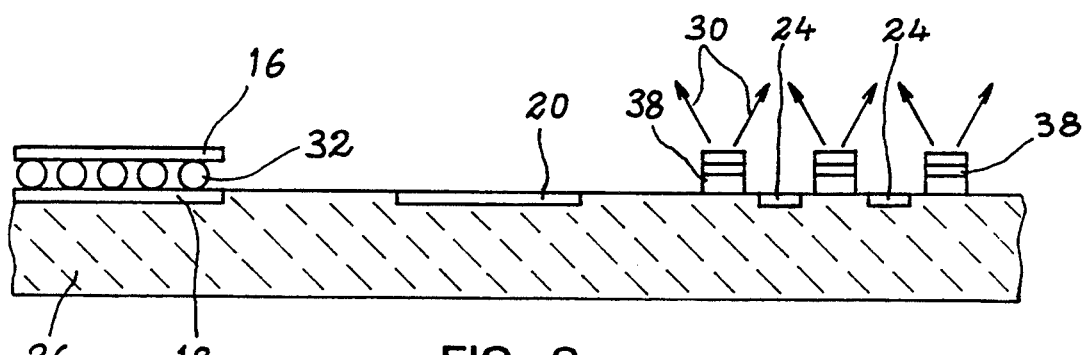
FIG. 6 A partial, diagrammatic view of another system according to the invention, in which an emitting mosaic is monolithically integrated into the system substrate.

When the emitting mosaic is monolithically placed on the silicon substrate 26 carrying its addressing circuit, the emission of light (visible or near infrared) can then take place via the front face of the emitter, as shown in FIG. 6. In this case, the addressing circuit 24 is located between the elementary photoemitters 38 (pixels), which is illustrated in FIGS. 4 and 5.

When the emitting mosaic 22 is hybridized on its addressing circuit 24, light emission then takes place through the rear face of the emitter 22.

A distinction must then be made between two cases.

In the first case, the substrate on which the elementary photoemitters are produced is transparent to the wavelength of the emitted light. This is the case of GaP substrates on which are produced $Ga_{1-x}As_xP$ (optionally $(Ga_{1-y}Al_y)_{1-x}In_xP$) light emitting diodes emitting in the visible range.

In this connection reference can be made to:

(7) Article by L. J. Stinson et al, entitled "High-efficiency InGaP light emitting diodes on GaP substrates" and published in Appl. Phys. Lett., vol. 58, No. 18, 6.5.1991, pp 2012 to 2014.

This can also be the case of GaAs substrates when the light photoemitters used emit in the near infrared.

However, it is then necessary to add to the system a light intensifier device.

Figure 7:
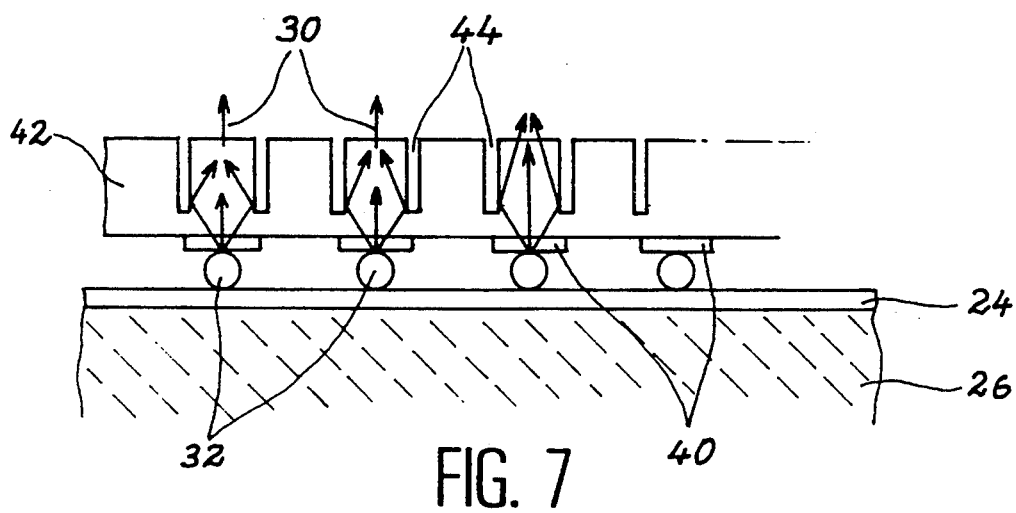
FIG. 7 A part, diagrammatic view of a system according to the invention, in which the emitter is produced on a substrate transparent to the light produced by said emitter, the latter being hybridized with its addressing circuit.

In this first case, whereof an example is diagrammatically and partially shown in FIG. 7, if the elementary light photoemitters are light emitting diodes 40, it is preferable for the substrate 42, on which said diodes 40 are formed and which is transparent to the light emitted to the latter, to be crosslinked so as to greatly limit the intermodulation risks between the pixels (corresponding to these diodes).

As can be seen in FIG. 7, such a configuration is obtained by means of grooves 44, which are formed in the substrate 42 and which separate the individual diodes 40. With vertical emission laser diodes there is no need for such a treatment of the substrate as a result of the highly directional nature of the light beams emitted by such vertical laser diodes. However, their manufacturing process is more difficult than that used for the aforementioned light emitting diodes.

In the second case, the substrate on which the elementary photoemitters are produced is not transparent to the wavelength of the light emitted (in the visible range) by said elementary photoemitters. This is the case with most substrates presently used in microelectronics (Si, Ge, InP, GaAs).

Figure 8:
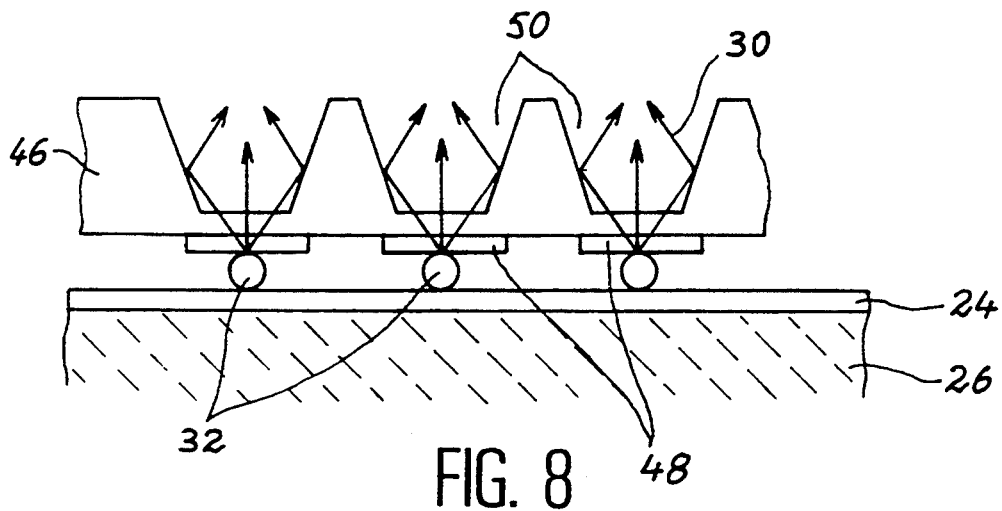
FIG. 8 A part, diagrammatic view of another system according to the invention, in which the emitter is produced on a substrate opaque to the light produced by said emitter.

Among these substrates, gallium arsenide is the best candidate for the application envisaged here. Thus, it is known to produce by epitaxy on GaAs various materials permitting the production of components emitting in the visible range (e.g. GaAlInP). FIG. 8 diagrammatically and partially illustrates said second case.

FIG. 8 shows the substrate on which is formed the emitting mosaic constituted by the light emitting diodes 48, which emit a light at which the substrate 46 is opaque, said emitting mosaic being hybridized with its reading circuit 24, as hereinbefore, with the aid of interconnection spheres 32.

In order to avoid reabsorption in said substrate 46 of the light emitted by the diodes 48, said substrates 46 is firstly made thinner, typically to a thickness of 50 to 100 micrometers, and then holes 50 are made perpendicular to the emitting diodes in order to free a passage for the emitted light 30. In this way, the intermodulation between the pixels is "naturally" very small.

There are numerous publications on epitaxy of GaAsInP on GaAs. Reference can be made in this connection to documents (5) and (6).

The process or the hybridization of the emission mosaic on its addressing circuit is the same as the process used for hybridizing the infrared detection mosaic on its reading circuit. A method for producing this hybridization is described in the following document:

(8) French patent application 89 05542 of 26.4.1989 (cf. also EP-A-395 488).

The production of holes, like the holes 50, in the GaAs substrate 46 will be described hereinafter.

The methods used are those which are in principle known and no further details will be given on this matter here.

The addition of an emitting mosaic in the focal plane common to the optical input means and the optical output means does not significantly increase the power dissipated in said focal plane, which is typically approximately 50 to 100 mW for a mosaic of 128×128 HgCdTe photodiodes. Thus, taking account of the integration time of the eye, it is possible to activate the emitter pixels in succession.

For example, if the emitting mosaic is a mosaic of 128×128 elementary photoemitters, for this purpose it is sufficient to use silicon electronic circuits, whose pass band is approximately 1 MHz. In this case, the overall consumption in the focal plane only increases by a few mW.

If the infrared detector used requires a cooling to 77K, it is then possible to use a cooler 52 (cf. FIG. 1) operating in accordance with a Stirling cycle. Certain of these coolers are very compact, have a limited weight and consume little energy.

If the infrared detector is able to operate at 200K (e.g. HgCdTe arrays in the wavelength range 3 to 5 micrometers), it is also possible to consider cooling by thermo-element modules.

Finally, certain infrared detectors (e.g. pyroelectric detectors) require no cooling. One way for producing an array of such pyroelectric detectors in monolithic manner on a silicon substrate is described in:

(9) French patent application 88 155 81 of 29.11.1988 (cf. also EP-A-371 868 and U.S. Pat. No. 5,008,541).

It should be noted that only the infrared detector requires cooling.

Consequently, the emitting mosaic can be at a temperature slightly above that of the infrared detector without bringing about any deterioration in system operation. This may make it possible to limit the size of the cold finger of the cooler operating according to the Stirling cycle.

The production of the system according to the invention makes use of various known procedures which will not be described here. Bibliographical references have already been given to provide information on the construction of the system components. For illustration and in non-limitative manner, exemplified constructions of certain of these elements and components will now be given.

For example, the infrared detector is a PtSi mosaic having 64×64 pixels, the elementary size of each pixel being 30 micrometers ×30 micrometers. This infrared detector is hybridized on a CMOS reading circuit and is cooled to 77K. Reference in this connection can be made to:

(10) Article by W. Kosonocky entitled "Review of Schottky-barrier imager technology" and published in SPIE, vol. 1308, Infrared Detectors and Focal Plane Arrays, 1990, pp 2 to 26.

The infrared detector is hybridized on its reading circuit by the method described in document (8). As PtSi detectors are very uniform, no complex correction circuit is used in this example.

For example, the emitting mosaic has 64×64 elements in the form of light emitting GaAlInP diodes, which emit in the visible range and which are produced in a gallium arsenide substrate. This emitting mosaic is produced from the following epitaxial structure (cf. FIG. 9):

a 500 micrometer thick, N+ doped, GaAs substrate 54, a 0.5 micrometer thick, N-doped with $N=10^{18}$ cm$^{-3}$, GaAs layer 56, a 1 micrometer thick, N-doped with $N=10^{18}$ cm$^{-3}$ and $x \geq 0.5$, $Ga_{1-x}Al_xAs$ layer 58, a 3 nanometer thick, N-doped with $N=10^{18}$ cm$^{-3}$, and $x \geq 0.7$ $Ga_{1-x}Al_xAs$ layer 59, a 0.01 micrometer thick, N-doped with $N=10^{18}$ cm$^{-3}$, GaAs layer 60, a 1 micrometer thick, N-doped with $N=10^{18}$ cm$^3$ $(Ga_{0.3}Al_{0.7})_{0.5}In_{0.5}P$ layer 62, a 0.6 micrometer, undoped with $x \leq 0.2$ $(Ga_{1-x}Al_x)_{0.5}In_{0.5}P$ layer 64, a micrometer thick, P-doped with $P=3 \times 10^{17}$ cm$^{-3}$ $(Ga_{0.3}Al_{0.7})_{0.5}In_{0.5}P$ layer 66, a 7 micrometer thick, P-doped with $P=3 \times 10^{18}$ cm$^{-3}$ $Ga_{0.3}Al_{0.7}As$ layer 68 and a 2 micrometer thick, P-doped with $P=3 \times 10^{18}$ cm$^{-3}$, GaAs layer 70.

Figure 9:
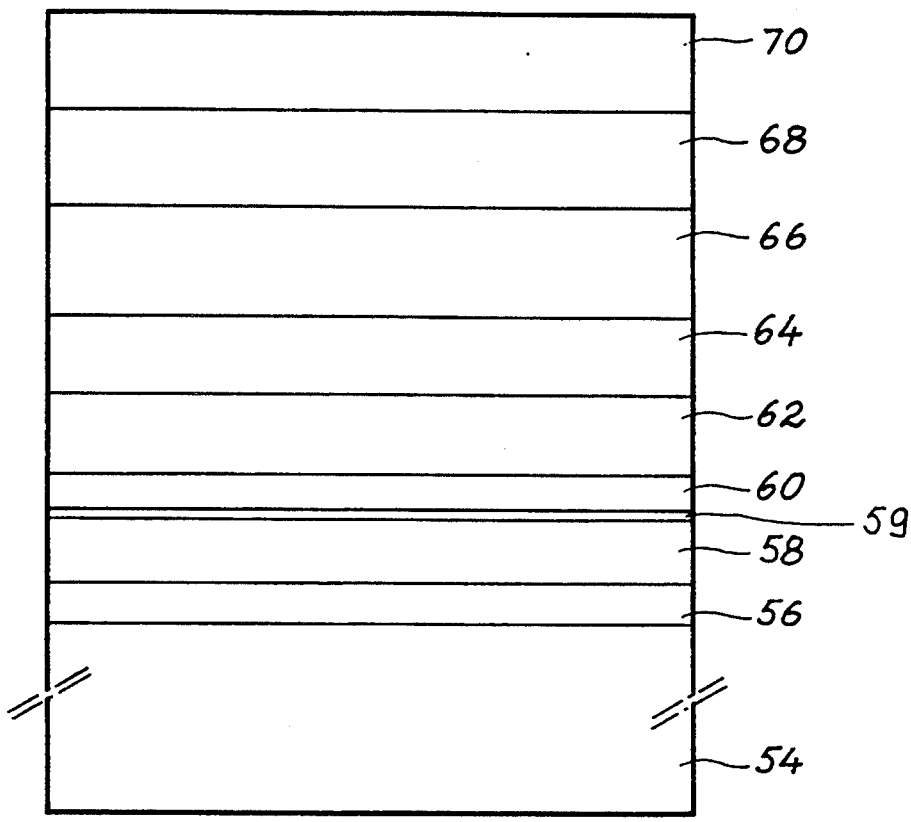
FIG. 9 Diagrammatically an epitaxial structure usable in the invention.

As can be seen in FIG. 9, these layers 56 to 70 are stacked in this order on the substrate 54.

This epitaxial structure is produced by vapour epitaxy with organometallics, but other methods could also be used.

The feasibility of the layers 56, 58, 59 and 60 has been clearly demonstrated. Moreover, document (6) establishes the feasibility of the stack of layers 62 to 70.

In addition, document (5) gives a production method making it possible to obtain the GaAlInP on GaAs layers (layer 60 serving as a substrate) in a very homogeneous manner.

The functions of the various layers will now be described. The layer 56 is a buffer layer ensuring a high quality epitaxy of the layers 58 and 60. The layers 58 and 59 make it possible to bring about selective etching or abraiding of GaAs with respect to GaAlAs in simple manner (chemical abraiding or reactive ionic etching). The layer 59 is transparent to the emitted light (cf. document (6)). Layer 60 makes it possible to stop the growth of the remainder of the structure on GaAs. Layer 60 has a sufficiently small thickness to only absorb a very small part of the emitted light. Layers 62 to 70 make it possible to produce a P/N junction as a basis for the production of light emitting diodes and reference can be made in this connection to document (6).

Details will be given hereinafter as to how the emitting mosaic is hybridized.

Stage 1: The epitaxial structure described is produced by referring to FIG. 9.

Stage 2: The light emitting diodes are produced. The feasibility of these light emitting diodes is demonstrated in document (6).

It must be stressed that in order to ensure the compatibility of the process described in document (6) with the hybridization stage, the component obtained, which carries the diodes, is then passivated, e.g. with the aid of a polyimide layer.

The electric contact of the substrate is ensured by a single electric wire welded to the rear face of the component, the conductive substrate making it possible to use a common contact for the entire mosaic of emitting diodes.

The size of a light emitting diode is e.g. 75 micrometers×75 micrometers. The emitting mosaic has 64×64 elementary diodes with a spacing of e.g. 200 micrometers.

Stage 3: The substrate is made thinner by conventional chemical or mechanical means, so that it is about 100 micrometers.

Stage 4: a protective layer which is resistant to abrasion (ionic or reactive) is deposited. For this purpose, deposition e.g. takes place of a thin alumina film using an electron gun.

Stage 5: Deposition of a photosensitive resin layer.

Stage 6: Positioning takes place by double face alignment of the openings to be etched in front of the emitting diodes. There are several double face positioning processes. For example, on a normal machine, the emitters will be positioned relative to a reticule, the assembly will then be locked in position, turned and then the holes will be aligned on marks located outside the reticule.

Stage 7: Irradiation and opening of the photosensitive resin (conventional process).

Figure 10:
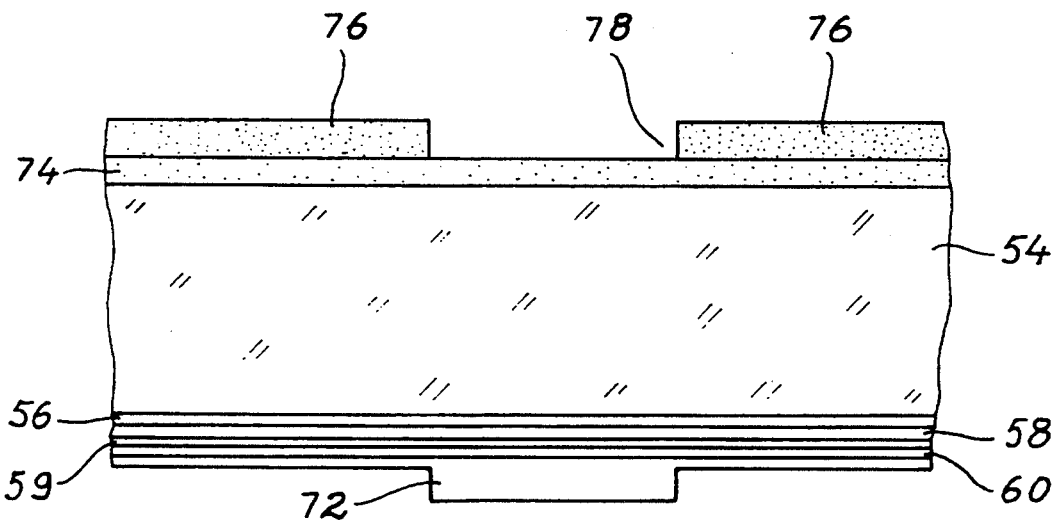
FIG. 10 Diagrammatically and partially the structure obtained after several stages of a process for producing a system according to the invention from the structure shown in FIG. 9.

FIG. 10 diagrammatically and partially illustrates the structure obtained after stages 1 to 7. FIG. 10 shows the substrate 54, which has been made thinner and carries the layers 56, 58, 59 and 60 and the diodes such as 72 on its upper face (which is oriented towards the bottom of FIG. 10, unlike in FIG. 9).

FIG. 10 also shows the alumina protective layer 74 deposited on the lower face of the substrate 54, as well as the resin layer 76 deposited on the alumina layer 74 and in which openings have been formed, such as the opening 78, facing the light emitting diodes such as 72.

Stage 8: Chemical etching of the protective layer. An alumina etching solution is $H_3PO_4$+isopropyl alcohol at 80° C. or 10% $H_2SO_4$ at 40° or 60° C.

Stage 9: Ionic working or reactive ionic working of the holes in the substrate up to a thickness of approximately 50 micrometers.

Stage 10: Hybridization on the addressing circuit by a process identical to that used for hybridizing the detection mosaic, cf. document (8).

Figure 11:
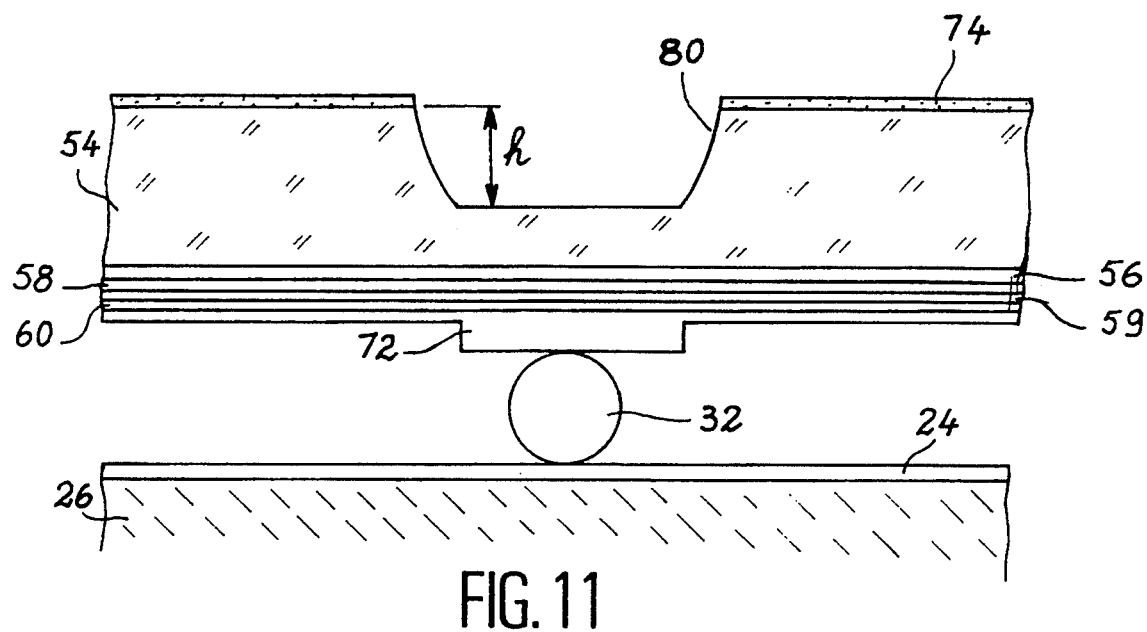
FIG. 11 Diagrammatically and partially the structure obtained after performing other stages of this process.

FIG. 11 diagrammatically and partially shows the structure obtained after stages 1 to 10.

FIG. 11 shows the silicon substrate 26 carrying the addressing circuit 24. It is also possible to see the substrate 54 carrying the diodes, such as the diode 72, hybridized by indium spheres such as the sphere 32 on the addressing circuit 24. It is also possible to see holes such as the hole 80, which have been formed in the thickness-reduced substrate 54 through the rear face thereof facing the light emitting diodes such as diode 72 and whose depth h is approximately 50 micrometers. The remainder of the alumina layer 74 is also visible.

Stage 11: Protection of the circuits present in the focal plane by a photosensitive resin layer and opening the latter on the rear face of the emitting mosaic (an approximate, macroscopic alignment being adequate).

Stage 12: Stage identical to stage 8, if the alumina layer has not completely disappeared through ionic working.

Stage 13: Reactive ionic or chemical etching of the GaAs in selective manner with respect to the layer 58. An example of the selective bath is given in: Article by T. KOBAYASHI et al, published in Japan J. Appl. Phys., vol. 12, 1973, No. 4, pp 619 to 620.

The layers 58, 59 are then chemically etched over a depth of 1.5 micrometer using a bath which can be $NH_4OH/H_2O_2/H_2O$. At the end of this etching operation, all that is left is part of the layer 60 with a sufficiently limited thickness to only absorb a small part of the emitted light.

Stage 14: Removal of the resin layer protecting the focal plane and deposited during stage 11.

Figure 12:
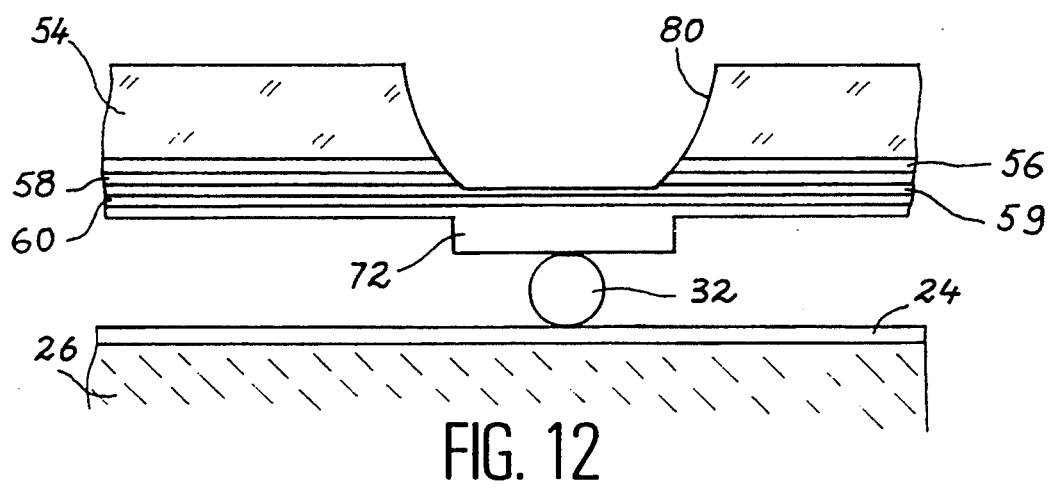
FIG. 12 Diagrammatically and partially the structure obtained after carrying out further stages of the process.

FIG. 12 diagrammatically and partially illustrates the structure obtained after stage 14.

It should be noted that the hybridization of the detecting mosaic only takes place after that of the emitting mosaic, i.e. following the stage 14 described hereinbefore.

Figure 13:
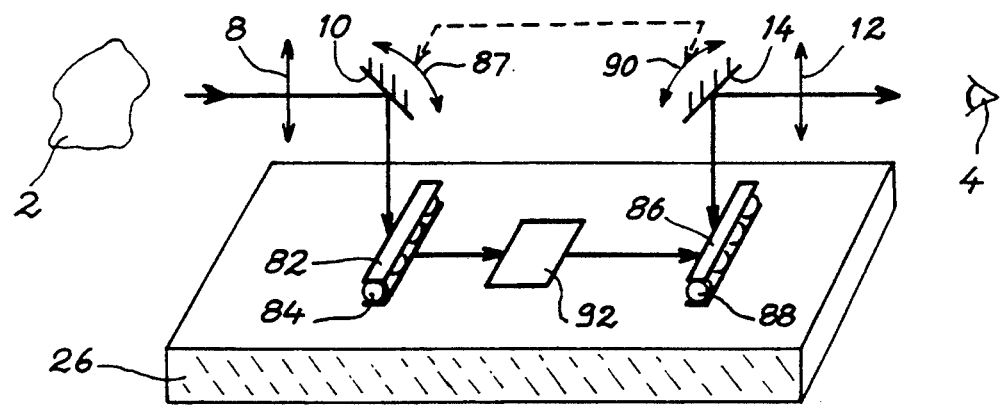
FIG. 13 A diagrammatic, partial view of a system according to the invention using a detecting array and an emitting array.

In another system according to the invention, the detecting mosaic 16 is replaced by an array of elementary infrared detectors 82, as shown in FIG. 13, which also shows the reading circuit 84 for said array 82.

In this case, the mirror 10 placed above the array 82 is provided with means 87, which are represented by a double curved arrow in FIG. 13 and which serve to scan the array 82 with the infrared beam from the scene 2, so as to form line by line the infrared image of the scene 2 on the array 82, which thus detects said infrared image.

FIG. 13 also shows that the emitting mosaic 22 can be replaced by an array of visible or near infrared light emitters 86, whose multiplexing/addressing circuit carries the reference 88 in FIG. 13.

In this case, the mirror 14 positioned facing the emitting array 86 is provided with means 90 symbolized by a double curved arrow in FIG. 13 and which enable the mirror to scan the array 86, so as to form in line by line manner the visible or near infrared image.

The means 87 and 90 are coupled so as to ensure the correspondence between the output image and the infrared image. The processing circuit used in the system of FIG. 13 carries the reference 92.

While this invention has been illustrated and described in accordance with a preferred embodiment, it is recognized that variations and changes may be made therein without departing from the invention as set forth in the claims.

What is claimed is:

1. System for the conversion of an infrared image into a visible or near infrared image, the system comprising:
   optical input means;
   optical output means;
   an infrared detector on which is formed an infrared image of a scene supplied to the detector by the optical input means;
   a circuit for reading signals supplied by the detector;
   a circuit for processing signals supplied by the reading circuit;
   a near infrared or visible light emitter for supplying, in conjunction with the optical output means, the image in a form of visible or near infrared light, from signals supplied by the processing circuit and a circuit for addressing the emitter, the addressing circuit being controlled by the processing circuit;
   a semiconductor substrate, the semiconductor substrate having a face forming a focal plane common to the optical input means and the optical output means; and
   the detector, the reading circuit, the processing circuit, the addressing circuit, and the emitter being integrated in the focal plane on the semiconductor substrate.

2. System according to claim 1, wherein the detector is a mosaic of infrared photodetectors.

3. System according to claim 1, wherein the detector is an array of infrared photodetectors, the system further comprising means for optical scanning of the array.

4. System according to claim 1, wherein the emitter is a mosaic of photoemitters in the visible or near infrared range.

5. System according to claim 1, wherein the emitter is an array of photoemitters in the visible or near infrared range, the system further comprising means for optical scanning of the array.

6. System according to claim 1, wherein the detector is hybridized with the reading circuit.

7. System according to claim 1, wherein the detector and the reading circuit are monolithically integrated with the semiconductor substrate.

8. System according to claim 1, wherein the emitter and addressing circuit are monolithically integrated with the semiconductor substrate.

9. System according to claim 1, wherein the emitter is adapted to produce light belonging to the near infrared range, the system further comprising means for converting the near infrared light into visible light.

10. System according to claim 1, further comprising means for cooling the detector.

11. System for the conversion of an infrared image into a visible or near infrared image, the system comprising:
    optical input means;
    optical output means;
    an infrared detector on which is formed an infrared image of a scene supplied to the detector by the optical input means;
    a circuit for reading signals supplied by the detector;
    a circuit for processing signals supplied by the reading circuit;
    a near infrared or visible light emitter for supplying, in conjunction with the optical output means, the image in a form of visible or near infrared light, from signals supplied by the processing circuit and a circuit for addressing the emitter, the addressing circuit being controlled by the processing circuit;
    a semiconductor substrate, the semiconductor substrate having a face forming a focal plane common to the optical input means and the optical output means; and
    the detector, the reading circuit, the processing circuit, the addressing circuit, and the emitter being integrated in the focal plane on the semiconductor substrate,
    wherein the emitter is hybridized with the addressing circuit and the emitter is formed on a second substrate transparent to light produced by the emitter.

12. System according to claim 11, wherein the emitter includes vertical emission laser diodes.

13. System according to claim 11, wherein the emitter includes a plurality of light emitting diodes.

14. System according to claim 13, wherein the second substrate is formed with grooves for separating the individual diodes.

15. System for the conversion of an infrared image into a visible or near infrared image, the system comprising:
    optical input means;
    optical output means;
    an infrared detector on which is formed an infrared image of a scene supplied to the detector by the optical input means;
    a circuit for reading signals supplied by the detector;
    a circuit for processing signals supplied by the reading circuit;
    a near infrared or visible light emitter for supplying, in conjunction with the optical output means, the image in a form of visible or near infrared light, from signals supplied by the processing circuit and a circuit for addressing the emitter, the addressing circuit being controlled by the processing circuit;
    a semiconductor substrate, the semiconductor substrate having a face forming a focal plane common to the optical input means and the optical means; and
    the detector, the reading circuit, the processing circuit, the addressing circuit, and the emitter being integrated in the focal plane on the semiconductor substrate,
    wherein the emitter is hybridized with the addressing circuit and the emitter is formed on an opaque substrate which is opaque to light emitted by said emitter, the opaque substrate having holes facing photoemitters forming the emitter, the holes permitting passage of the light produced by the emitter.

* * * * *